United States Patent [19]

Shichijo

[11] Patent Number: 5,164,917
[45] Date of Patent: Nov. 17, 1992

[54] VERTICAL ONE-TRANSISTOR DRAM WITH ENHANCED CAPACITANCE AND PROCESS FOR FABRICATING

[75] Inventor: Hisashi Shichijo, Garland, Tex.

[73] Assignee: Texas Instruments Incorporated, Dallas, Tex.

[21] Appl. No.: 741,197

[22] Filed: Jul. 30, 1991

Related U.S. Application Data

[63] Continuation of Ser. No. 749,347, Jun. 26, 1985, abandoned.

[51] Int. Cl.[5] .................................. G11C 11/24
[52] U.S. Cl. .................................. 365/149; 365/182; 365/189.01
[58] Field of Search .............. 365/149, 182, 189.01; 357/23.6, 55

[56] References Cited

U.S. PATENT DOCUMENTS

| | | | |
|---|---|---|---|
| 3,961,355 | 6/1976 | Abbas et al. | 357/49 |
| 4,003,036 | 1/1977 | Jenne | 340/173 |
| 4,105,475 | 8/1978 | Jenne | 148/175 |
| 4,116,720 | 9/1978 | Vinson | 148/1.5 |
| 4,199,772 | 4/1980 | Natori et al. | 357/23 |
| 4,225,945 | 9/1980 | Kuo | 365/149 |
| 4,364,074 | 12/1982 | Garnache et al. | 357/23 |
| 4,369,564 | 1/1983 | Hiltpold | 29/571 |
| 4,432,006 | 2/1984 | Takei | 357/23 |
| 4,462,040 | 7/1984 | Ho et al. | 357/23 |
| 4,476,623 | 10/1984 | El-Kareh | 29/576 |
| 4,568,958 | 2/1986 | Baliga | 357/23.4 |
| 4,630,088 | 12/1986 | Ogura et al. | 357/23.6 |
| 4,651,184 | 3/1987 | Malhi | 357/23.6 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,704,368 | 11/1987 | Goth et al. | 437/60 |
| 4,713,678 | 12/1987 | Womack et al. | 357/23.6 |
| 4,717,942 | 1/1988 | Nakamura et al. | 365/149 |
| 4,751,558 | 6/1988 | Kenney | 357/23.6 |

FOREIGN PATENT DOCUMENTS

| | | |
|---|---|---|
| 66081 | 12/1982 | European Pat. Off. . |
| 108390 | 5/1984 | European Pat. Off. . |
| 118878 | 9/1984 | European Pat. Off. . |
| 167764 | 1/1986 | European Pat. Off. . |
| 0176254 | 4/1986 | European Pat. Off. ............ 357/23.6 |
| 176254 | 4/1986 | European Pat. Off. . |
| 186875 | 7/1986 | European Pat. Off. . |
| 0186875 | 7/1986 | European Pat. Off. ............ 357/23.6 |
| 0177066 | 9/1986 | European Pat. Off. ............ 357/23.6 |
| 198590 | 10/1986 | European Pat. Off. . |
| 88451 | 9/1988 | European Pat. Off. . |

(List continued on next page.)

OTHER PUBLICATIONS

IBM Technical Disclosure Bulletin, vol. 30, No. 7, Dec. 1987, "Multi-plate Storage Compacitor for DRAM", pp. 462–464.

(List continued on next page.)

Primary Examiner—Terrell W. Fears
Attorney, Agent, or Firm—Ira S. Matsil; B. Peter Barndt; Richard L. Donaldson

[57] ABSTRACT

One embodiment of the present invention is a one transistor DRAM cell having enhanced capacitance and minimized soft error rate by providing an ungrounded cell capacitor plate which is insulated from the substrate. The structure includes a vertical transistor on the sides of a vertical depression or trench in a substrate. In the bottom of the trench, a memory cell capacitor is fabricated. This capacitor includes a conductive polycrystalline silicon post through the middle of the capacitor, thereby increasing the surface area of the capacitor plates. This increases the capacitance of the memory cell capacitor.

The ungrounded plate of the memory cell capacitor is fabricated in the trench and is insulated from the substrate. This ungrounded plate is connected to the vertical transistor via a polycrystalline silicone plug. Thus this embodiment of the present invention reduces soft error rate by providing a fully insulated ungrounded memory cell capacitor plate.

14 Claims, 4 Drawing Sheets

FOREIGN PATENT DOCUMENTS

| | | |
|---|---|---|
| 2706155 | 8/1978 | Fed. Rep. of Germany . |
| 3508996 | 10/1985 | Fed. Rep. of Germany . |
| 3525418A1 | 1/1986 | Fed. Rep. of Germany . |
| 56-51854 | 10/1954 | Japan . |
| 55-11365 | 7/1963 | Japan . |
| 57-10973 | 1/1982 | Japan . |
| 58-3269 | 1/1983 | Japan . |
| 58-10861 | 1/1983 | Japan . |
| 59-181661 | 3/1983 | Japan . |
| 58-204568 | 11/1983 | Japan . |
| 58-213464 | 12/1983 | Japan . |
| 59-103373 | 6/1984 | Japan . |
| 59-141262 | 8/1984 | Japan .................................. 357/23.6 |
| 60-12752 | 1/1985 | Japan . |
| 60-182161 | 9/1985 | Japan . |
| 60-261165 | 12/1985 | Japan . |
| 61-36965 | 2/1986 | Japan . |
| 61-73366 | 4/1986 | Japan . |
| 2002958 | 2/1979 | United Kingdom . |
| 2168195A1 | 2/1985 | United Kingdom . |

OTHER PUBLICATIONS

Jambotkar; IBM TDB, vol. 27, No. 2; Jul. 1984; pp. 1313–1320, "Compact One-Device Dynamic RAM cell with High Storage Capacitance".

Clarke et al.; IBM TDB, vol. 17, No. 9; Feb. 1975; pp. 2579–2580, "Capacitor For Single FET Memory Cell".

Kenney; IBM TDB; vol. 23, No. 9; Feb. 1981; pp. 4052–4053, "Reduced Bit Line Capacitances in VMOS Devices".

Barson; IBM TDB; vol. 21, No. 7; Dec. 1978; pp. 2755–2756, "Dynamic DMOS Random-Access Memory Cell Design w/Trench".

Lee et al.; IBM TDB; vol. 22, No. 8B, Jan. 1980; pp. 3630–3634, "Short Channel Field-Effect Transistors in V-Grooves".

Nakajima et al.; IEDM; 1984; pp. 240–243, "An Isolation-Merged Vertical Capacitor Cell for Large Capacity DRAM".

VERTICAL ONE-TRANSISTOR DRAM WITH ENHANCED CAPACITANCE AND PROCESS FOR FABRICATING

This application is a continuation of application Ser. No. 06/749,347 filed Jun. 26, 1985 now abandoned.

FIELD OF THE INVENTION

The present invention relates to the field of integrated circuit design and fabrication. More specifically, the present invention relates to a structure and process for use in the fabrication of integrated memory circuits.

BACKGROUND OF THE INVENTION

A common goal in the fabrication of integrated circuitry is to minimize the surface area of the integrated circuit required for various structures. This goal is of particular importance in the fabrication of digital memory circuitry. Because each memory cell in a memory circuit is repeated, small savings of surface area in the memory cells leads to large savings in the overall surface area of the integrated circuit. To this end, vertical DRAM cells have been developed such as the invention of Chatterjee et al., U.S. patent application Ser. No. 679,663, filed on Dec. 7, 1984, which is assigned to the Assignee of the present application and is hereby incorporated by reference.

A one transistor DRAM cell usually consists of a control transistor having a gate and source controlled by external word and bit lines and a drain connected to a capacitor which has its opposite plate grounded. Data is written into the memory cell by storing charge on the capacitor. Because charge will eventually leak off the capacitor, the cell must be periodically refreshed. The amount of time between refreshed cycles is increased by increasing the capacitance of the capacitor. Thus increased capacitance is desirable with this type of DRAM cell. In addition, stray fields, alpha particles and charges in the substrate may effect the charge stored on the capacitor if the ungrounded plate of the capacitor is not insulated from the substrate. Thus it is desirable to provide a storage capacitor having an ungrounded plate which is insulated from the substrate.

SUMMARY OF THE INVENTION

One embodiment of the present invention is a one transistor DRAM cell having enhanced capacitance and minimized soft error rate by providing an ungrounded cell capacitor plate which is insulated from the substrate. The structure includes a vertical transistor on the sides of a vertical depression or trench in a substrate. In the bottom of the trench, a memory cell capacitor is fabricated. This capacitor includes a conductive polycrystalline silicon post through the middle of the capacitor which is connected to the substrate, thereby increasing the surface area of the capacitor plates. This increases the capacitance of the memory cell capacitor.

The ungrounded plate of the memory cell capacitor is fabricated in the trench and is insulated from the substrate. This ungrounded plate is connected to the vertical transistor via a polycrystalline silicon plug. Thus this embodiment of the present invention reduces soft error rate by providing a fully insulated ungrounded memory cell capacitor plate.

DETAILED DESCRIPTION

Figure 1A:
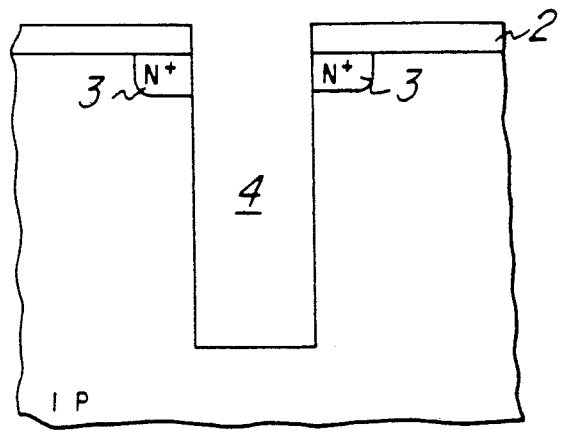
FIGS. 1A through 1G are side view schematic drawings depicting the processing steps of one embodiment of the present invention.

FIG. 1A is a side view schematic diagram depicting the initial processing steps of one embodiment of the present invention. N+ regions 3 are formed on the surface of P type substrate 1 using techniques well known in the art. Silicon dioxide layer 2 is thermally grown to a thickness of approximately 2500 angstroms and patterned to provide an etch mask for etching trench 4. Trench 4 may be fabricated to have the dimension perpendicular to the plane of the page of any length. However, in the preferred embodiment the mouth of trench 4 is approximately square. Trench 4 is then fabricated using an anisotropic plasma etching process.

Figure 1B:
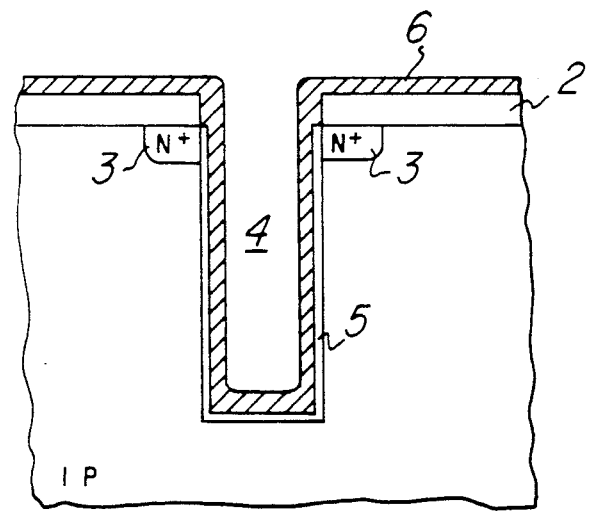
Figure 1C:
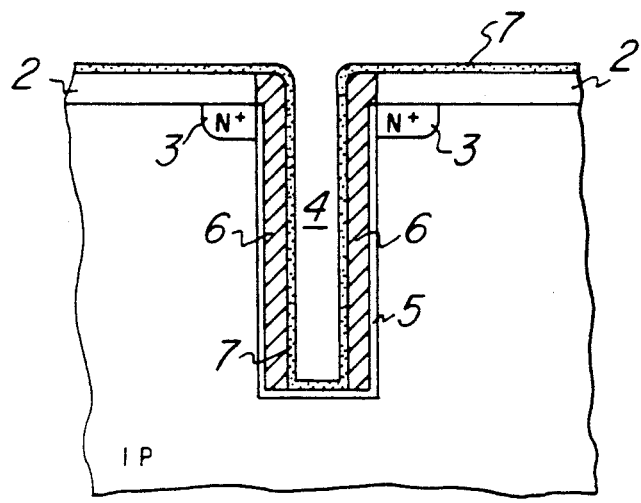
Figure 1D:
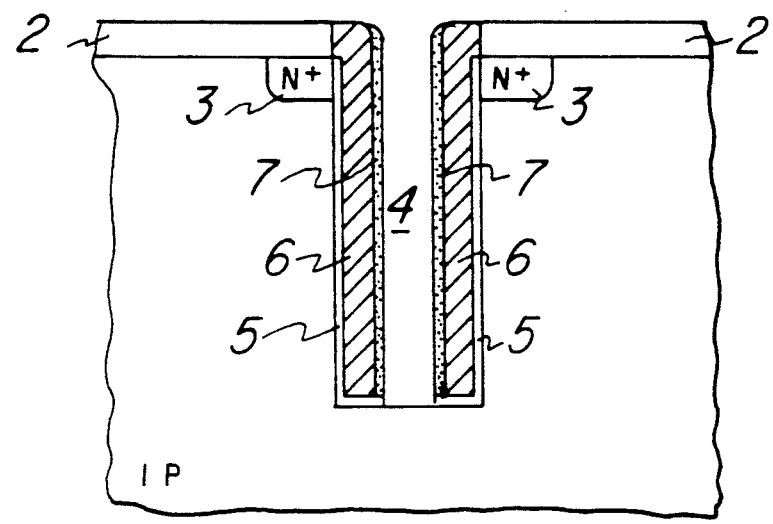
Figure 1E:
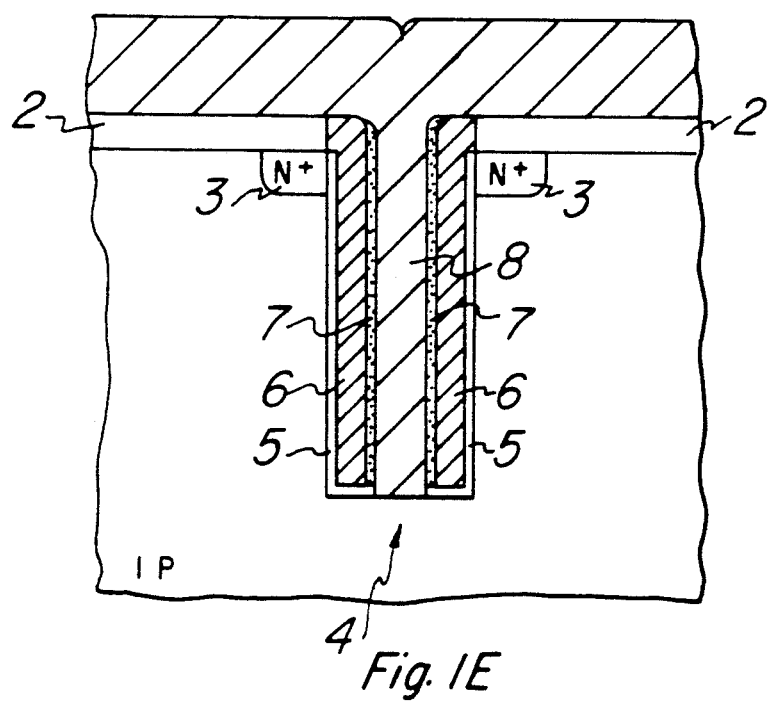
Figure 1F:
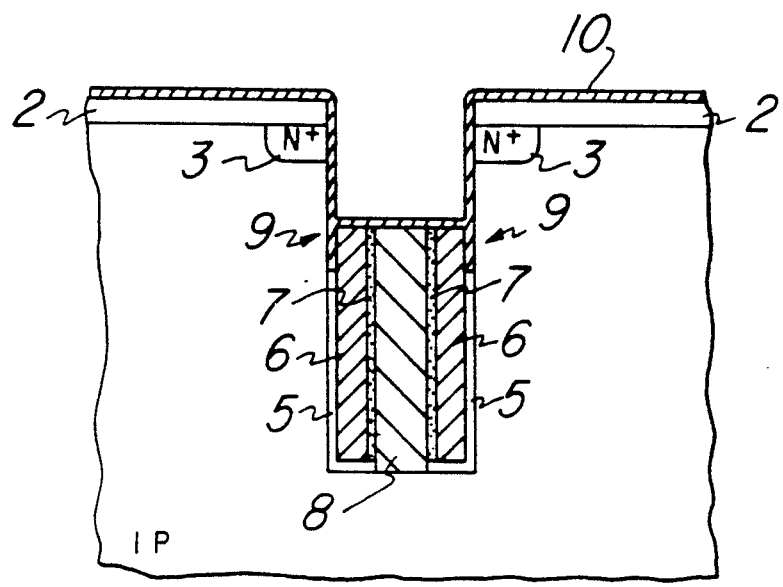
Figure 1G:
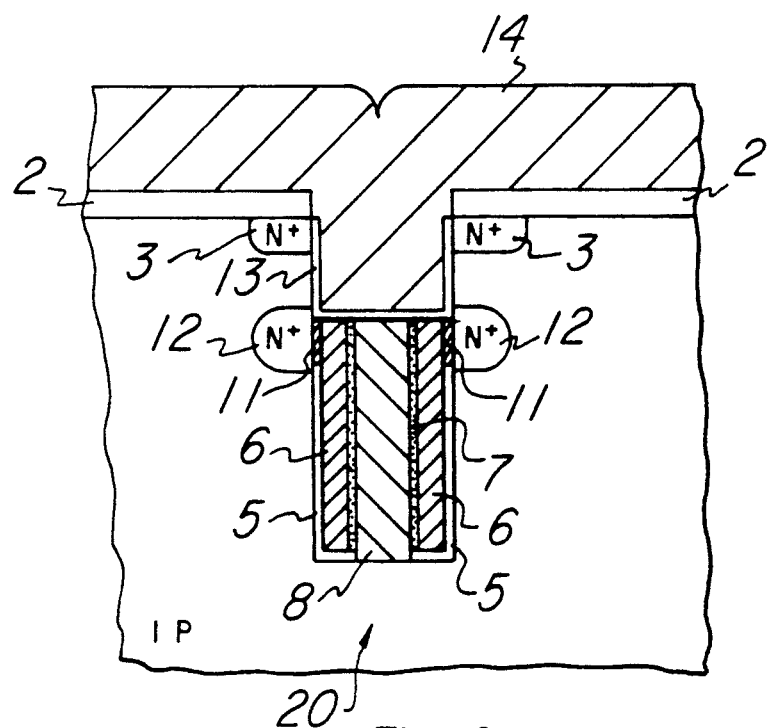

Silicon dioxide layer 5 is thermally grown on the surface of trench 4 as shown in FIG. 1B. Silicon dioxide layer 5 has a thickness of approximately 150 angstroms. Polycrystalline silicon layer 6 is then deposited using chemical vapor deposition to a thickness of approximately 1500 angstroms. Polycrystalline silicon layer 6 is heavily doped using N type dopants during the deposition of polycrystalline silicon layer 6. Polycrystalline silicon layer 6 is then anisotropically etched to provide the structure as shown in FIG. 1C. Silicon nitride layer 7 is then deposited using chemical vapor deposition to a thickness of approximately 100 angstroms. Silicon nitride layer 7 is then anisotropically etched to provide the structure shown in FIG. 1D. An anisotropic etching process is then used to remove the portion of silicon dioxide layer 5 in the bottom of trench 4. Trench 4 is then filled with polycrystalline silicon layer 8, which is heavily doped with P type dopant ions during deposition, as shown in FIG. 1E. The entire structure formed in trench 4 including polycrystalline silicon layer 8, silicon nitride layer 7, polycrystalline silicon layer 6 and silicon dioxide layer 5 is then etched back to provide the structure shown in FIG. 1F. Silicon dioxide layer 5 is then further etched using a selective etching process to provide plug openings 9 as shown in FIG. 1F. These plug openings are then filled by depositing polycrystalline silicon layer 10. Polycrystalline silicon layer 10 is then etched away leaving only polycrystalline silicon plugs 11 as shown in FIG. 1G. Silicon dioxide layer 13 is then thermally grown to a thickness of approximately 250 angstroms. During this thermal growth, the heavy doping of polycrystalline silicon layers 6 provides N type dopant atoms which diffuse through polycrystalline silicon plugs 11 into substrate 1, thus forming N+ drains 12. Polycrystalline silicon layer 14 is then deposited using chemical vapor deposition to a thickness of approximately 5000 angstroms.

Thus a DRAM memory cell is fabricated having a pass transistor comprised of source 3, gate 14 and drain 12, and a capacitor having polycrystalline silicon layers 6 and along with substrate 1 serving as plates. Polycrystalline silicon layer 8 provides an extension of grounded plate of the memory cell capacitor thus providing increased capacitance or allowing a shallower trench 4 to be fabricated providing the same capacitance.

Figure 2:
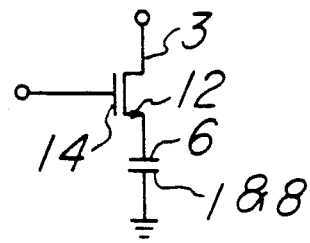
FIG. 2 is an electrical schematic diagram of a DRAM cell such as the described embodiment of the present invention.
Figure 3:
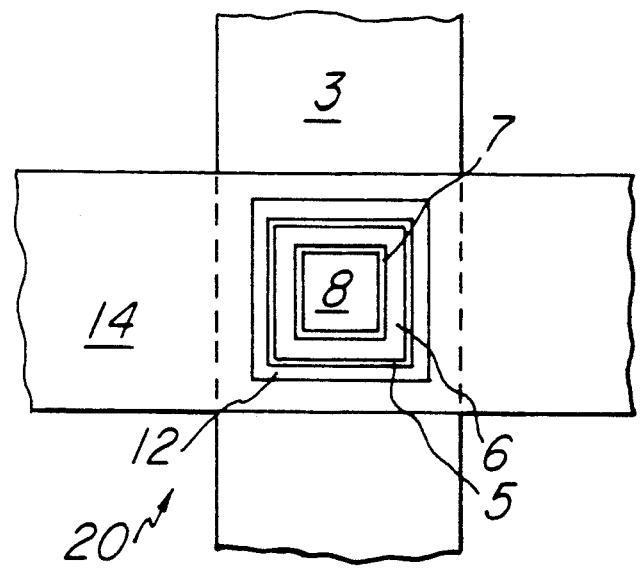
FIG. 3 is a plan view depicting the layout of the word and bit lines of a memory cell including one embodiment of the present invention in relation to the memory cell which is one embodiment of the present invention.

FIG. 2 is an electrical schematic diagram of DRAM memory cell 20 indicating the electrical function provided by the components shown in FIG. 1G. FIG. 3 is a plan view of the surface of an integrated circuit containing memory cell 20. In a normal memory array, polycrystalline silicon word line 14 would extend the width of the array thus providing a word line for several memory cells. In addition, source diffusion 3 would normally extend the length of the array thus providing a bit line for several cells.

TECHNICAL ADVANTAGES

The present embodiment of the invention provides a memory cell fabricated using a vertical structure in a single trench. Because the trench may be fabricated having horizontal dimensions equal to that of the minimum feature geometry allowed by a particular lithography system, thus providing an entire memory cell in an area equal to that of the gate of a past transistor using prior art techniques. In addition, the present invention provides a trench type memory cell having increased capacitance and a minimized soft error rate.

I claim:

1. A memory cell comprising:
   a semiconductor substrate having a surface, said substrate defining a trench having a wall substantially perpendicular to said surface;
   a first conductive layer formed on the wall of said trench and insulated therefrom;
   a second conductive layer within said trench and formed adjacent to and insulated from said conductive layer and electrically connected to said substrate; and
   a transistor formed substantially within said substrate and having its source to drain path along said substantially perpendicular wall and connected to said first conductive layer.

2. Memory cell as in claim 1 wherein said first conductive layer is one plate of a capacitor and said second conductive layer is another plate of said capacitor.

3. Memory cell as in claim 1 wherein said first conductive layer is one plate of a capacitor and said substrate is another plate of said capacitor.

4. Memory cell as in claim 1 wherein said first conductive layer is one plate of a first capacitor and said second conductive layer is another plate of said first capacitor and said first conductive layer is one plate of a second capacitor and said substrate is another plate of said second capacitor.

5. Memory cell as in claim 1 including an insulating layer between said substantially perpendicular wall and said first conductive layer.

6. Memory cell as in claim 5 wherein said insulating layer includes an oxide.

7. Memory cell as in claim 1 including an insulating layer between said first and second conductive layers.

8. Memory cell as in claim 7 wherein said insulating layer includes a nitride.

9. Memory cell as in claim 1 wherein said transistor includes a gate located along said substantially perpendicular wall within said trench and insulated from said first and second conductive layers.

10. A memory cell as in claim 1 wherein said depression has a substantially vertical wall.

11. A memory cell as in claim 1 wherein said second conductive layer is surrounded by said first conductive layer except at the bottom of said trench.

12. A memory cell as in claim 1 wherein said transistor is a field effect transistor.

13. A memory cell as in claim 1 wherein said first and second conductive layers are insulated from each other by a dielectric layer.

14. A memory comprising:
   a plurality of memory cells formed in a semiconductor substrate and having a top surface, said substrate defining a plurality of trenches, each trench having a wall substantially perpendicular to said surface, each memory cell associated one each with a related one of said plurality of trenches and having:
      a first conductive layer fabricated on said substantially perpendicular wall of said selected one of said plurality of trenches and insulated from said substrate;
      a second conductive layer within said selected trench formed adjacent to but insulated from said first conductive layer and being electrically coupled to said substrate;
      a transistor fabricated in said semiconductor substrate and along said substantially perpendicular wall of said selected trench having a first current handling terminal, a second current handling terminal connected to said first conductive layer, and a control terminal within said selected trench.

* * * * *